(12) United States Patent
Kasuya

(10) Patent No.: US 6,762,102 B2
(45) Date of Patent: Jul. 13, 2004

(54) METHODS FOR MANUFACTURING SEMICONDUCTOR DEVICES AND SEMICONDUCTOR DEVICES

(75) Inventor: Yoshikazu Kasuya, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/963,168

(22) Filed: Sep. 26, 2001

(65) Prior Publication Data

US 2002/0084476 A1 Jul. 4, 2002

(30) Foreign Application Priority Data

Sep. 26, 2000 (JP) ...................................... 2000-292141

(51) Int. Cl.$^7$ .......................................... H01L 21/336
(52) U.S. Cl. ..................... 438/287; 438/302; 438/303; 438/305; 438/591; 438/785
(58) Field of Search .................. 438/287, 303, 438/302, 305, 591, 785

(56) References Cited

U.S. PATENT DOCUMENTS

| | | | | |
|---|---|---|---|---|
| 4,786,609 | A | * 11/1988 | Chen | 437/30 |
| 5,306,655 | A | * 4/1994 | Kurimoto | 437/44 |
| 5,391,510 | A | 2/1995 | Hsu et al. | 437/44 |
| 5,405,787 | A | 4/1995 | Kurimoto | 437/28 |
| 5,434,093 | A | 7/1995 | Chau et al. | 437/41 |
| 5,721,443 | A | * 2/1998 | Wu | 257/344 |
| 5,879,998 | A | * 3/1999 | Krivokapic | 438/300 |
| 5,937,299 | A | * 8/1999 | Michael et al. | 438/299 |
| 5,960,270 | A | 9/1999 | Misra et al. | 438/197 |
| 5,976,934 | A | * 11/1999 | Hayakawa | 438/258 |
| 5,986,302 | A | * 11/1999 | Fukatsu et al. | 257/315 |
| 6,087,231 | A | * 7/2000 | Xiang et al. | 438/287 |
| 6,228,717 | B1 | * 5/2001 | Hazama et al. | 438/265 |
| 6,271,094 | B1 | * 8/2001 | Boyd et al. | 438/287 |
| 6,348,385 | B1 | * 2/2002 | Cha et al. | 438/287 |
| 6,365,459 | B1 | * 4/2002 | Leu | 438/266 |
| 6,403,997 | B1 | * 6/2002 | Inumiya et al. | 257/288 |
| 6,465,359 | B2 | 10/2002 | Yamada et al. | 438/706 |

FOREIGN PATENT DOCUMENTS

JP        4-155932        * 5/1992

OTHER PUBLICATIONS

U.S. application Ser. No. 09/963,924, filed Sep. 26, 2001, having U.S. patent Appl. Pub. No. US2002/0084498 A1, published on Jul. 4, 2002.
U.S. application Ser. No. 09/963,903, filed Sep. 26, 2001, having U.S. patent Appl. Pub. No. US2002/0117726 A1, published on Aug. 29, 2002.

* cited by examiner

*Primary Examiner*—Wael Fahmy
*Assistant Examiner*—Shrinivas H. Rao
(74) *Attorney, Agent, or Firm*—Konrad Raynes & Victor, LLP; Alan S. Raynes

(57) ABSTRACT

Semiconductor devices and methods for manufacturing the same in which deterioration of electrical characteristics are suppressed are described. One method for manufacturing a semiconductor device includes the steps of: (a) forming a gate dielectric layer 20; (b) forming a polysilicon layer 32 having a specified pattern on the gate dielectric layer 20; (c) forming sidewall spacers 50 on side walls of the polysilicon layer 32; (d) depositing an insulation layer 62 that covers the polysilicon layer 32; (e) planarizing the insulation layer 62 until an upper surface of the polysilicon layer 32 is exposed; (f) removing a part of the polysilicon layer 32 in a manner so that at least the gate dielectric layer 20 is not exposed, to thereby form a recessed section 80 on the polysilicon layer 32; and (g) filling a metal layer 34 in the recessed section 80 to form a gate electrode that includes at least the polysilicon layer 32 and the metal layer 34.

23 Claims, 8 Drawing Sheets

Fig. 9 (a) (prior art)
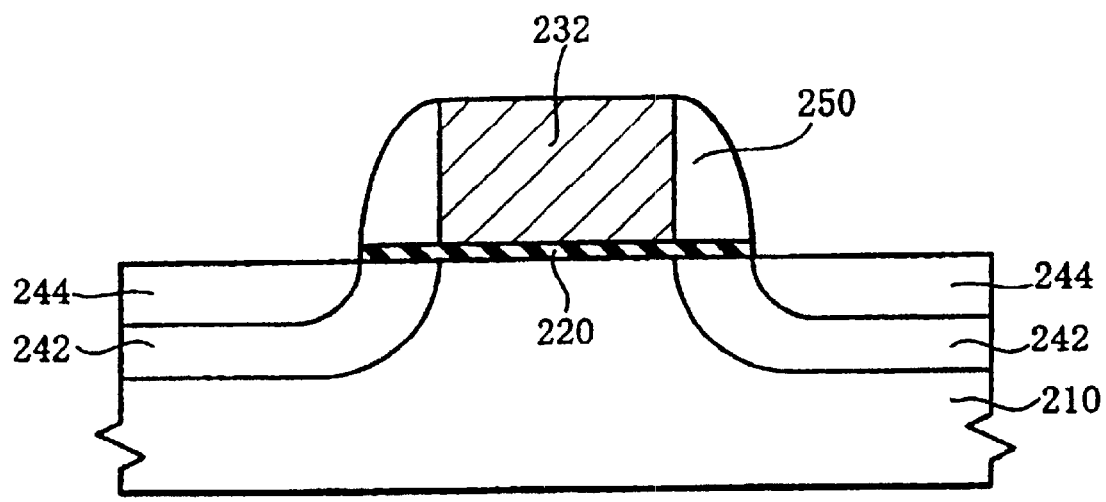
Fig. 9 (b) (prior art)
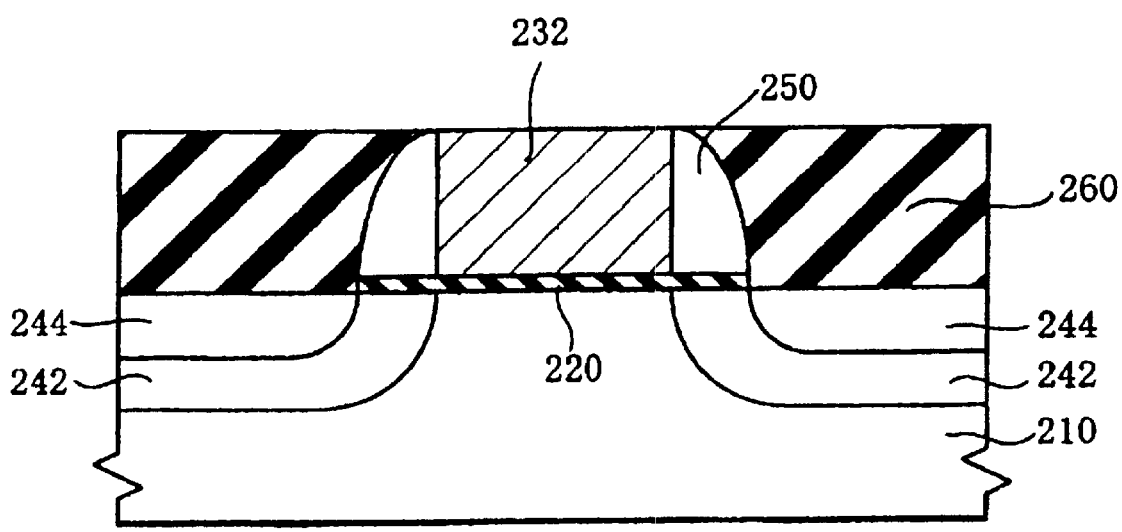

Fig. 10 (a) (prior art)
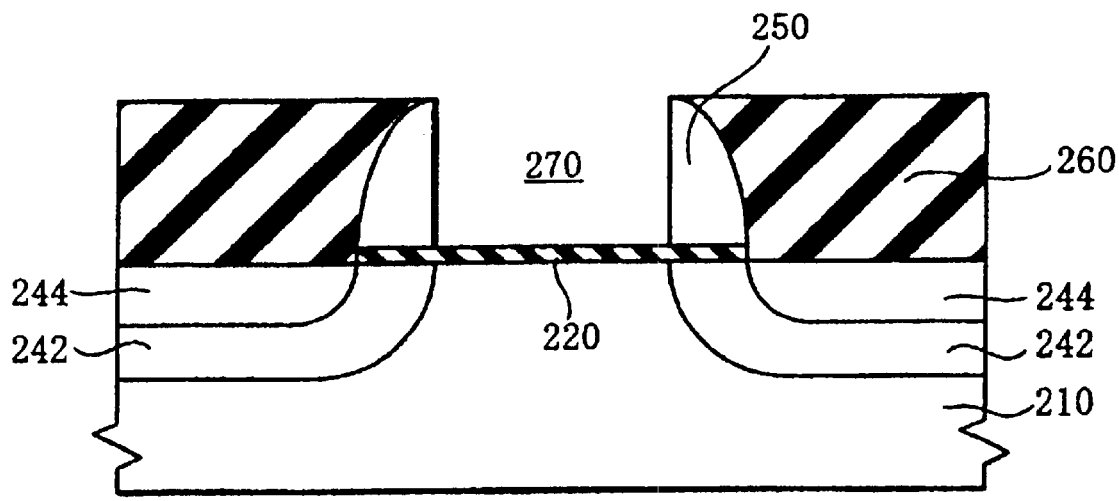
Fig. 10 (b) (prior art)
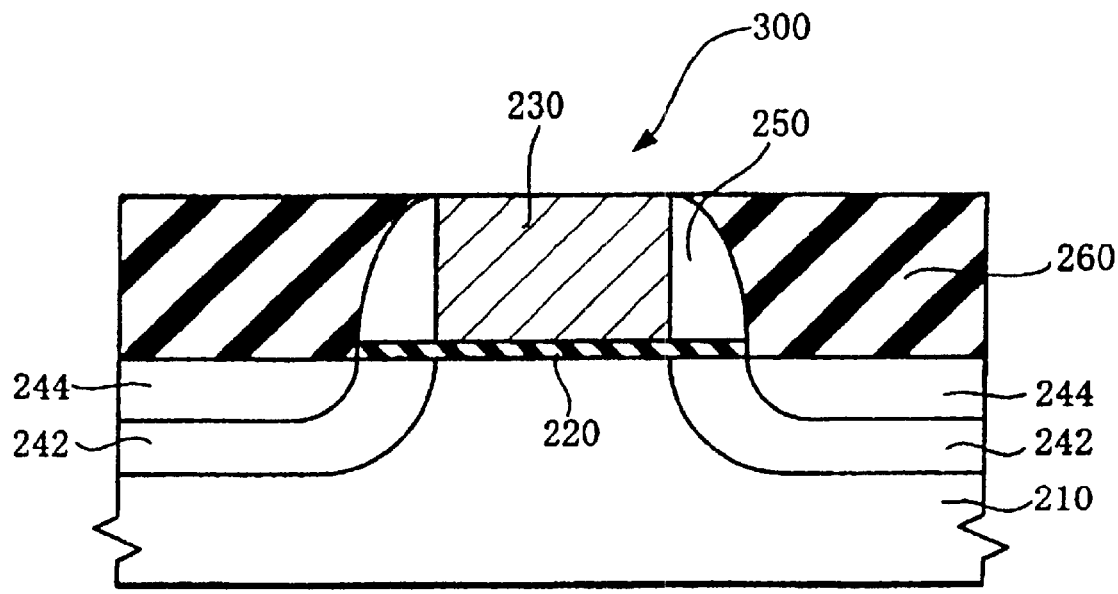

METHODS FOR MANUFACTURING SEMICONDUCTOR DEVICES AND SEMICONDUCTOR DEVICES

Applicant hereby incorporates by reference Japanese Application No. 2000-292141, filed Sep. 26, 2000, in its entirety. Applicant hereby incorporates by reference U.S. application Ser. No. 09/963,903 in its entirety. Applicant hereby incorporates by reference U.S. application Ser. No. 09/963,924 in its entirety.

TECHNICAL FIELD

The present invention relates to semiconductor devices having a field effect transistor and methods for manufacturing the same, and more particularly, to semiconductor devices having a gate electrode that is formed from two or more layers and methods for manufacturing the same.

RELATED ART

Currently, there is a technique in which a gate electrode 230 of a MOS transistor 300 shown in FIG. 10(*b*) is formed by a so-called damascene method. One example of a method for manufacturing a MOS transistor 300 using a technique in which its gate electrode 230 is formed by a damascene method is described below.

As shown in FIG. 9(*a*), a gate dielectric layer 220 (also sometimes referred to as a gate insulation layer) and a dummy electrode 232 are formed on a silicon substrate 210. Next, the dummy electrode 232 is patterned. Then, a low concentration impurity diffusion layer 242 is formed in the silicon substrate 210 on the sides of the dummy electrode 232. Next, an insulation layer (not shown) is formed over the entire surface, and the insulation layer and the gate dielectric layer 220 are etched by RIE (reactive ion etching) to form a sidewall spacer 250 on the side wall of the dummy electrode 232. Then, a high concentration impurity diffusion layer 244 is formed in the silicon substrate 210 on the side of the sidewall spacer 250.

Next, as shown in FIG. 9(*b*), an insulation layer 260 is formed on the silicon substrate 210, and the insulation layer 260 is then planarized to expose the dummy electrode 232.

Next, as shown in FIG. 10(*a*), the entire dummy electrode 232 is removed to form a through hole 270.

Next, as shown in FIG. 10(*b*), a metal layer is formed in a manner to fill the through hole 270, and the metal layer is then etched-back to form a gate electrode 230.

Techniques to form gate electrodes by a damascene method are described in several references such as U.S. Pat. No. 5,960,270, U.S. Pat. No. 5,391,510 and U.S. Pat. No. 5,434,093.

SUMMARY

Embodiments include to a method for manufacturing a semiconductor device, the method including the steps of: (a) forming a gate dielectric layer; (b) forming a first conduction layer having a specified pattern on the gate dielectric layer; (c) forming sidewall spacers on side walls of the first conduction layer; (d) depositing an insulation layer that covers the first conduction layer and the sidewall spacers; (e) planarizing the insulation layer until an upper surface of the first conduction layer is exposed; (f) removing a part of the first conduction layer in a manner so that the gate dielectric layer is not exposed, to thereby form a recessed section on the first conduction layer; and (g) filling a second conduction layer in the recessed section to form a gate electrode that includes at least the first conduction layer and the second conduction layer.

Embodiments also include a method for manufacturing a semiconductor device, the method including forming a gate dielectric layer on a substrate and forming a first conduction layer having a specified pattern on the gate dielectric layer. Sidewall spacers are formed on side walls of the first conduction layer. A part of the first conduction layer is removed in a manner so that the gate dielectric layer is not exposed, to thereby form a recessed section on the first conduction layer. A second conduction layer is provided in the recessed section to form a gate electrode that includes at least the first conduction layer and the second conduction layer.

Embodiments also include a semiconductor device including a field effect transistor, the field effect transistor including a gate dielectric layer, a gate electrode, sidewall spacers, a source region and a drain region. The gate electrode includes a first conduction layer and a second conduction layer. The first conduction layer is formed over the gate dielectric layer, and the second conduction layer is formed over the first conduction layer. The sidewall spacers are formed on side walls of the gate electrode. When the thickness of the first conduction layer is compared based on a top surface of the gate dielectric layer, the first conduction layer has thickness that gradually becomes greater from a central section thereof toward the side walls thereof.

Embodiments also include a semiconductor device including a field effect transistor, the field effect transistor including a gate dielectric layer, a gate electrode, sidewall spacers, a source region and a drain region. The gate electrode includes a first conduction layer and a second conduction layer. The first conduction layer is formed over the gate dielectric layer, and the second conduction layer is formed over the first conduction layer. The sidewall spacers are formed on side walls of the gate electrode. When the thickness of the first conduction layer is compared based on a top surface of the gate dielectric layer, an end portion of the first conduction layer has a greater thickness as compared to a thickness thereof at a central section thereof.

BRIEF DESCRIPTION OF THE DRAWINGS

Embodiments of the invention are described with reference to the accompanying drawings which, for illustrative purposes, are schematic and not necessarily drawn to scale.

FIGS. 9a and 9(b) schematically show cross-sectional views illustrating steps of a method for manufacturing a semiconductor device in a conventional example.

FIGS. 10a and 10(b) schematically show cross-sectional views illustrating steps of a method for manufacturing a semiconductor device in a conventional example.

DETAILED DESCRIPTION

Figure 1:
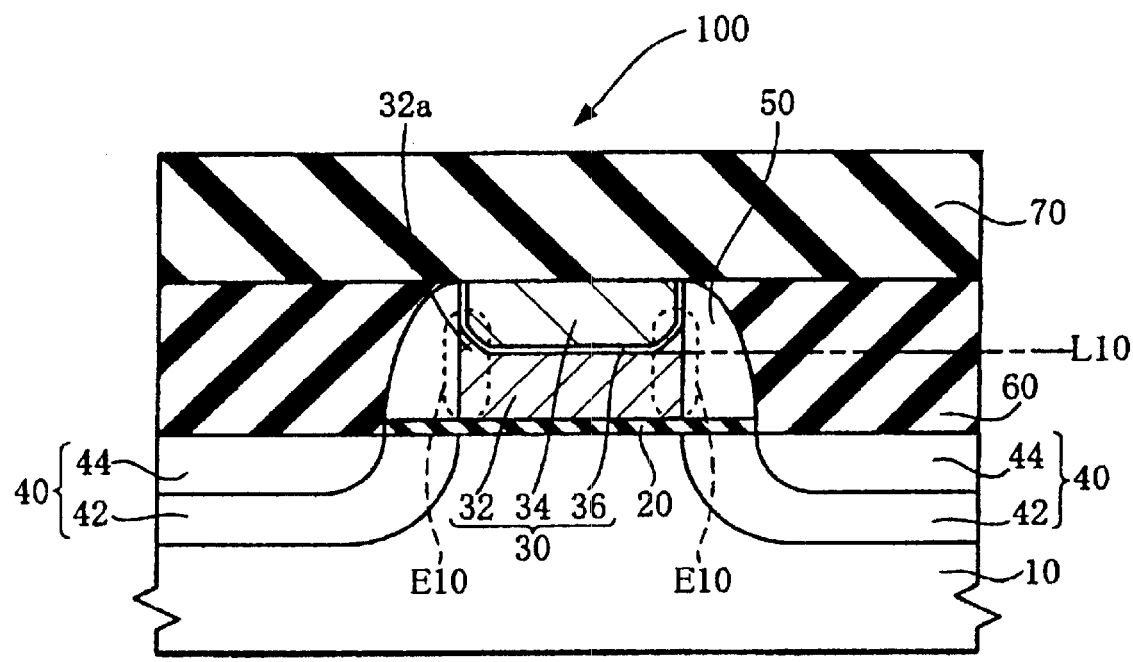
FIG. 1 schematically shows a cross-sectional view of a semiconductor device in accordance with an embodiment of the present invention.
Figure 2:
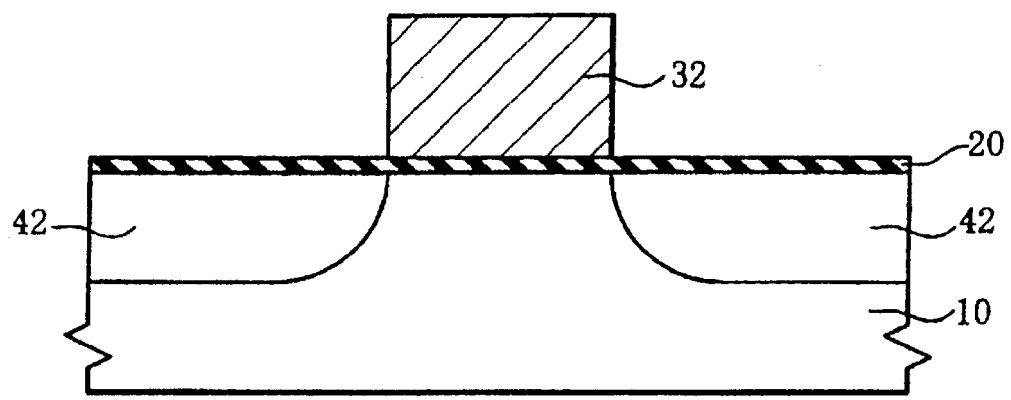
FIGS. 2(*a*) and 2(*b*) schematically show cross-sectional views illustrating steps of a method for manufacturing a semiconductor device in accordance with an embodiment of the present invention.
Figure 2:
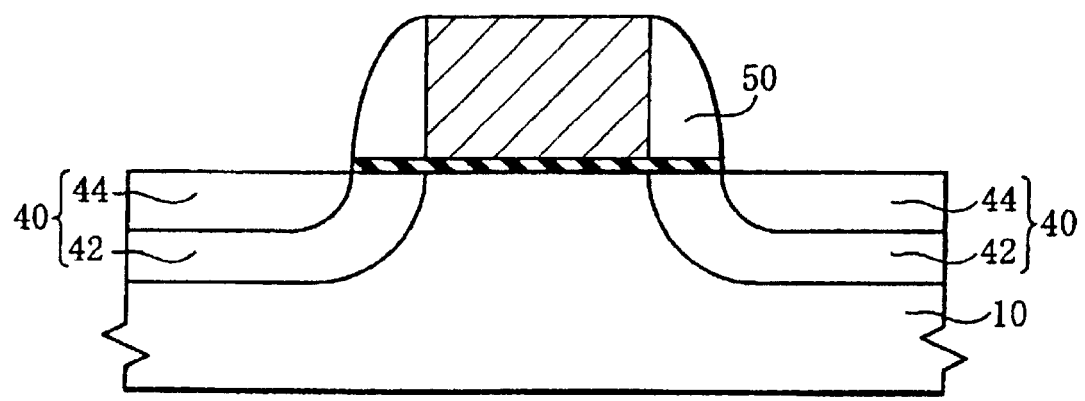
Figure 3:
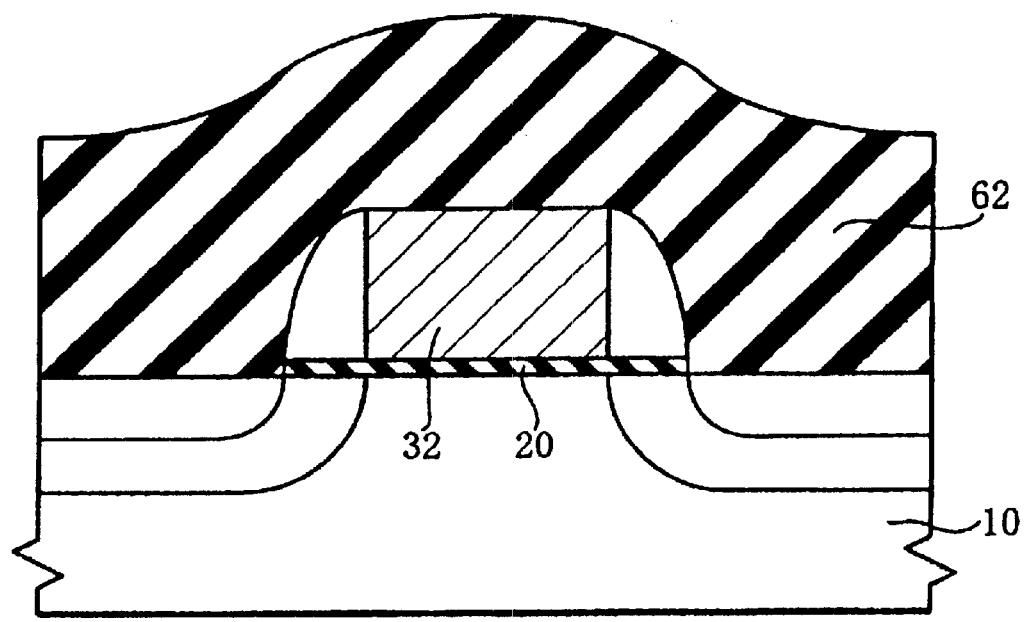
FIGS. 3(*a*) and 3(*b*) schematically show cross-sectional views illustrating steps of a method for manufacturing a semiconductor device in accordance with an embodiment of the present invention.
Figure 3:
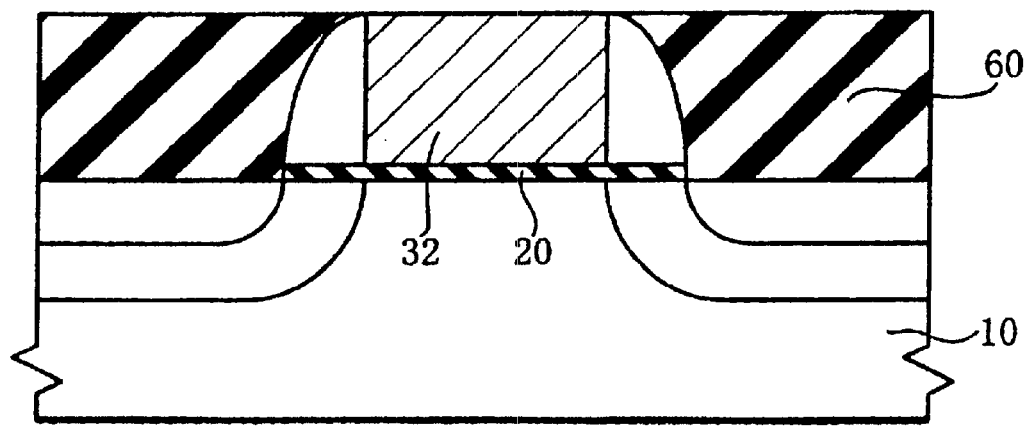
Figure 4:
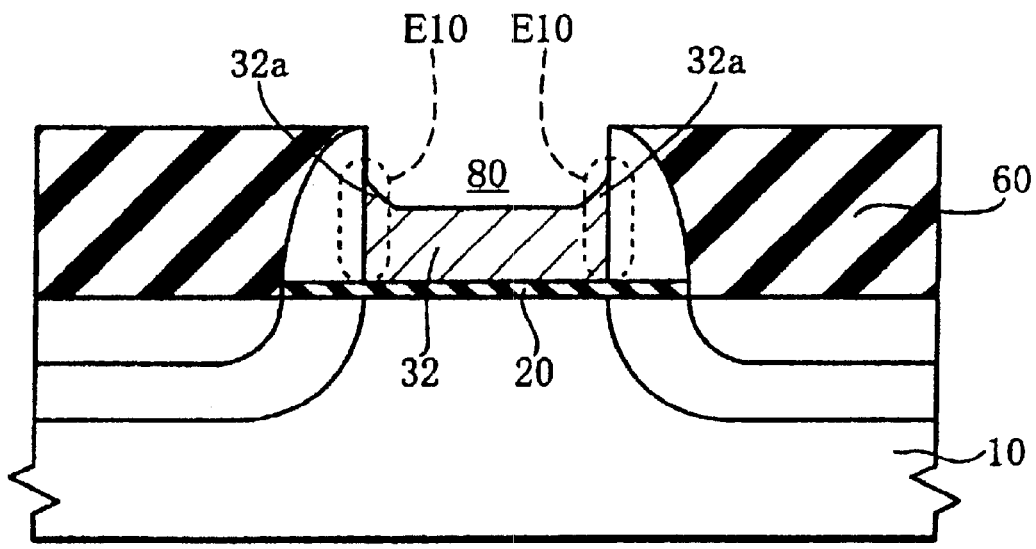
FIGS. 4(*a*) and 4(*b*) schematically show cross-sectional views illustrating steps of a method for manufacturing a semiconductor device in accordance with an embodiment of the present invention.
Figure 4:
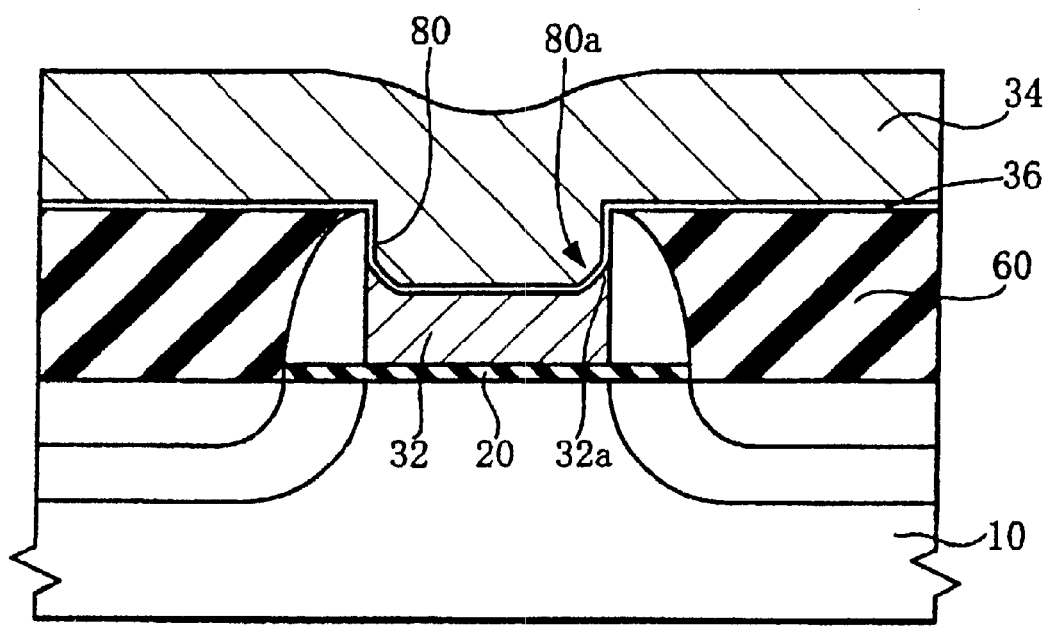

It is an object of certain embodiments of the present invention to provide a semiconductor device and a method for manufacturing the same in which deterioration of the electrical characteristics is suppressed.

A method for manufacturing a semiconductor device in accordance with an embodiment of the present invention comprises the steps (a)–(g) of:

(a) forming a gate dielectric layer;

(b) forming a first conduction layer having a specified pattern on the gate dielectric layer;

(c) forming sidewall spacers on side walls of the first conduction layer;

(d) depositing an insulation layer that covers the first conduction layer and the sidewall spacers;

(e) planarizing the insulation layer until an upper surface of the first conduction layer is exposed;

(f) removing a part of the first conduction layer in a manner that at least the gate dielectric layer is not exposed to thereby form a recessed section on the first conduction layer; and (g) filling a second conduction layer in the recessed section to form a gate electrode that includes at least the first conduction layer and the second conduction layer.

In the present embodiment, the gate dielectric layer is not exposed in step (f). As a result, deterioration of the gate dielectric layer is suppressed.

Also, in accordance with the present embodiment, the second conduction layer is formed over the first conduction layer in step (g). Also, source and drain regions thereof can be formed before step (d). Accordingly, the second conduction layer can be formed after the formation of the source and drain regions. As a result, deterioration of the second conduction layer, which may occur when a resist layer that is provided for forming the source and drain regions is removed, may be prevented. Accordingly, deterioration of the second conduction layer can be suppressed. Also, in accordance with the present embodiment, a chemical agent that is incompatible with the second conduction layer, but that can securely remove the resist layer can be selected. In view of the above, in accordance with the present embodiment, a semiconductor device in which deterioration of its electrical characteristics are suppressed can be formed.

Between step (f) and step (g), step (h) of forming a barrier layer above the first conduction layer may be included. By forming a barrier layer, mutual diffusion of materials composing the first conduction layer and the second conduction layer can be suppressed.

The first conduction layer may preferably be formed from a material that includes silicon. By this, a variety of process techniques to be employed when a gate electrode is formed from silicon can be used.

The second conduction layer may be one of metal, a metal alloy and a metal compound.

A first semiconductor device in accordance with an embodiment of the present invention includes a field effect transistor, the field effect transistor including a gate dielectric layer, a gate electrode, sidewall spacers, a source region and a drain region, wherein the gate electrode includes a first conduction layer and a second conduction layer, the first conduction layer being formed over the gate dielectric layer, the second conduction layer being formed over the first conduction layer, and the sidewall spacers being formed on side walls of the gate electrode, wherein, as the thickness of the first conduction layer is compared based on a top surface of the gate dielectric layer, the first conduction layer has thickness that gradually becomes greater from a central section thereof toward the side walls thereof.

A second semiconductor device in accordance with an embodiment of the present invention includes a field effect transistor, the field effect transistor including a gate dielectric layer, a gate electrode, sidewall spacers, a source region and a drain region, wherein the gate electrode includes a first conduction layer and a second conduction layer, the first conduction layer being formed over the gate dielectric layer, the second conduction layer being formed over the first conduction layer, and the sidewall spacers being formed on side walls of the gate electrode, wherein, as the thickness of the first conduction layer is compared based on a top surface of the gate dielectric layer, an side end portion of the first conduction layer has a greater thickness as compared to a thickness at a central section thereof.

In addition to the features described above for the first and second semiconductor devices, embodiments may also have at least some of the following features.

(a) In certain embodiments, the semiconductor device may further comprise an interlayer dielectric layer on a side of the gate electrode, wherein an upper surface of the interlayer dielectric layer and an upper surface of the second conduction layer are substantially at an identical level. It is noted that the "substantially an identical level" means that they are substantially at the same height from the upper surface of the gate dielectric layer as a reference.

(b) In certain embodiments, a barrier layer is formed between at least the first conduction layer and the second conduction layer.

Certain preferred embodiments of the present invention are described below with reference to the accompanying drawings.

A semiconductor device in accordance with an embodiment of the present invention is described below. FIG. 1 schematically shows a cross-sectional view of a semiconductor device in accordance with the present embodiment. More specifically, a semiconductor device 100 has a structure as follows.

A gate dielectric layer 20 is formed on a silicon substrate 10. A gate electrode 30 is formed on the gate dielectric layer.

The gate electrode 30 is formed from a polysilicon layer (first conduction layer) 32, a barrier layer 36 and a metal layer (second conduction layer) 34 successively formed over the gate dielectric layer 20. Sidewall spacers 50 are formed on both sides of the gate electrode 30. Also, the barrier layer 36 is also formed between the sidewall spacers 50 and the metal layer 34. It is noted that the barrier layer 36 has a function to inhibit or prevent metal of the metal layer 34 from diffusing into the polysilicon layer 32.

The characteristics of the cross-sectional shape of the polysilicon layer 32 are described below. The polysilicon layer 32 has protruded sections 32a at side end sections E10 at upper sections thereof. More specifically, the level of the upper surface of the polysilicon layer 32 at the side end sections E10 upwardly protrudes compared to a level L10 of the upper surface of the polysilicon layer 32 at its central section. In other words, the thickness of the polysilicon layer 32 is not uniform as measured based on the upper surface of the gate dielectric layer 20, but gradually increases from the central section toward the sidewall (toward the side of the sidewall spacers 50). As a result, due to the protruded sections 32a formed at the side end sections E10, the side end sections of the polysilicon layer 32 have tapered shape.

Source and drain regions 40 are formed in the silicon substrate 10 on the sides of the gate electrode 30. The source and drain regions 40 have a low concentration impurity diffusion layer 42 and a high concentration impurity diffusion layer 44. The low concentration impurity diffusion layer 42 is formed in a manner to enclose the high concentration impurity diffusion layer 44, in other words, has a double drain structure (double diffused drain). However, without being limited to this structure, the source and drain regions 40 can have other structures such as a LDD (lightly doped drain) structure.

A first interlayer dielectric layer 60 is formed on the sides of the gate electrode 30 with the sidewall spacers 50 being interposed therebetween. The upper surface of the metal layer 34 and the upper surface of the first interlayer dielectric layer 60 are substantially at the same level (height) as measured based on the upper surface of the gate dielectric layer 20. A second interlayer dielectric layer 70 is formed on the first interlayer dielectric layer 60.

A method for manufacturing a semiconductor device in accordance with an embodiment of the present invention is described below. FIG. 2 through FIG. 5 schematically show cross-sectional views in a process for manufacturing a semiconductor device in accordance with the present embodiment.

First, as shown in FIG. 2(a), a stacked layered body of a gate dielectric layer 20 and a polysilicon layer (first conduction layer) 32 is formed on a silicon substrate 10. The stacked layered body may be formed by depositing a dielectric layer and a polysilicon layer on the silicon substrate 10, and patterning the polysilicon layer. The thickness of the polysilicon layer 32 is, for example, 100–1000 nm.

Next, a resist layer having a specified pattern is formed over the silicon substrate 10. Next, a low concentration impurity diffusion layer 42 is formed by ion-implanting an impurity in the silicon substrate 10 using the resist layer as a mask. Then, the resist layer is removed by an acid chemical agent.

Next, as shown in FIG. 2(b), sidewall spacers 50 are formed on both sides of the polysilicon layer 32 by a known method. The material of the sidewall spacers can be, for example, silicon oxide, silicon nitride or the like. Next, a resist layer having a specified pattern is formed on the silicon substrate 10. Next, an impurity is ion-implanted in the silicon substrate 10 using the resist layer as a mask to form a high concentration impurity diffusion layer 44. Then, the resist layer is removed by an acid chemical agent. As a result, source and drain regions 40 are formed.

Next, as shown in FIG. 3(a), an insulation layer 62 is formed over the silicon substrate 10 in a manner to cover the polysilicon layer 32 and the sidewall spacers 50. The insulation layer 62 can be formed by, for example, a CVD method. Silicon oxide is an example of a material that can be used as the material of the insulation layer 62. The thickness of the insulation layer 62 is determined in view of the thickness of the polysilicon layer 32 when the insulation layer 62 is formed, and may be, for example, 150–1500 nm.

Next, as shown in FIG. 3(b), the insulation layer 62 is planarized. In this manner, a first interlayer dielectric layer 60 is formed. The insulation layer 62 is planarized until the upper surface of the polysilicon layer 32 is exposed. The insulation layer 62 may be planarized by, for example, a chemical-mechanical polishing method.

Next, as shown in FIG. 4(a), a part of the polysilicon layer 32 is etched in a manner that the gate dielectric layer 20 is not exposed. As a result, a recessed section 80 is formed in an upper portion of the polysilicon layer 32. The thickness of the polysilicon layer 32 that is removed is defined in view of characteristics of a desired gate electrode, and may be for example 50–950 nm, and more preferably 50–800 nm. The etching can be conducted by, for example, a reactive ion etching.

In this etching, as shown in FIG. 4(a), protruded sections 32a are preferably formed at side end sections E10 of the polysilicon layer 32 at upper sections thereof. The protruded sections 32a are formed because the side end sections E10 of the polysilicon layer 32 are more difficult to etch compared to the central section of the polysilicon layer 32.

Also, in this etching step, not the entire polysilicon layer 32 is removed, but only a specified thickness thereof is partially removed. As a result, in the etching of the polysilicon layer 32, the gate dielectric layer 20 is not exposed. Accordingly, the gate dielectric layer 20 can be prevented from being damaged during the etching of the polysilicon layer 32.

Next, as shown in FIG. 4(b), a barrier layer 36 is preferably formed over the entire surface. By forming the barrier layer 36 over the entire surface, the upper surface of the polysilicon layer 32 is covered by the barrier layer 36. For example, titanium nitride, titanium tungsten, tungsten nitride, and tantalum nitride may be used as the material of the barrier layer 36. The barrier layer 36 can be formed by, for example, a CVD method.

Next, a metal layer 34 is preferably deposited over the entire surface, to fill the recessed section 80. In this instance, because the protruded sections 32a are formed in the polysilicon layer 32, the metal layer 34 can be readily deposited at corner sections 80a of the recessed section 80. This is because the polysilicon layer 32 has a tapered configuration due to the protruded sections 32a formed at the side end sections E10, with the result that the step coverage is improved. For example, tungsten, aluminum, copper, an alloy of aluminum and copper, and a compound of silicon and metal may be used as the material of the metal layer 34. For example, titanium silicide, tungsten silicide, cobalt silicide, molybdenum silicide or the like may be used as a compound of silicon and metal. The metal layer 34 can be formed by, for example, a CVD method.

Figure 5:
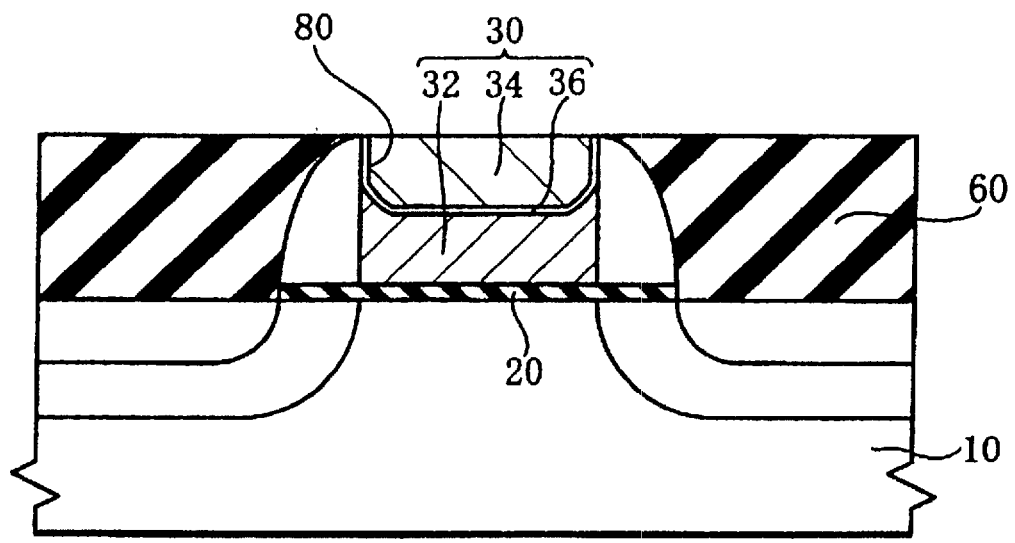
FIG. 5 schematically shows a cross-sectional view illustrating one step of a method for manufacturing a semiconductor device in accordance with an embodiment of the present invention.

Next, as shown in FIG. 5, the metal layer 34 is planarized in a manner that the metal layer 34 remains only in the recessed section 80. As a result, a gate electrode 30 is formed. The metal layer 34 can be planarized by, for example, a chemical-mechanical polishing method. In this planarization, the barrier layer 36 on the first interlayer dielectric layer 60 is also removed.

Next, as shown in FIG. 1, a second interlayer dielectric layer 70 is formed on the first interlayer dielectric layer 60 and the metal layer 34 by a known method. In the manner described above, the semiconductor device 100 is manufactured.

The present embodiment preferably includes the effects described below.

(1) The present embodiment includes the step of etching the polysilicon layer 32 to form a recessed section. In this step, not the entire polysilicon layer 32 is removed, but only a specified thickness thereof is partially removed. As a result, in the etching of the polysilicon layer 32, the gate dielectric layer 20 is not exposed. Accordingly, the gate dielectric layer 20 is not damaged during the etching of the polysilicon layer 32.

(2) In the present embodiment, the polysilicon layer 32 is formed in a manner to contact the gate dielectric layer 20 at the gate electrode 30. As a result, a variety of process techniques to be employed when a gate electrode is formed from polysilicon can be used. It is noted that, when the polysilicon layer 32 is entirely removed such that the gate electrode is formed only from a metal layer, a work function difference between the gate electrode and the silicon substrate becomes greater compared to when the gate electrode includes silicon. As a result, when the gate electrode is formed only from a metal layer, a variety of process techniques to be employed when a gate electrode is formed from polysilicon are difficult to be employed.

(3) A MOS transistor with its gate electrode having a stacked layered structure of a polysilicon layer and a metal layer can be formed, for example, in the following manner.

Figure 6:
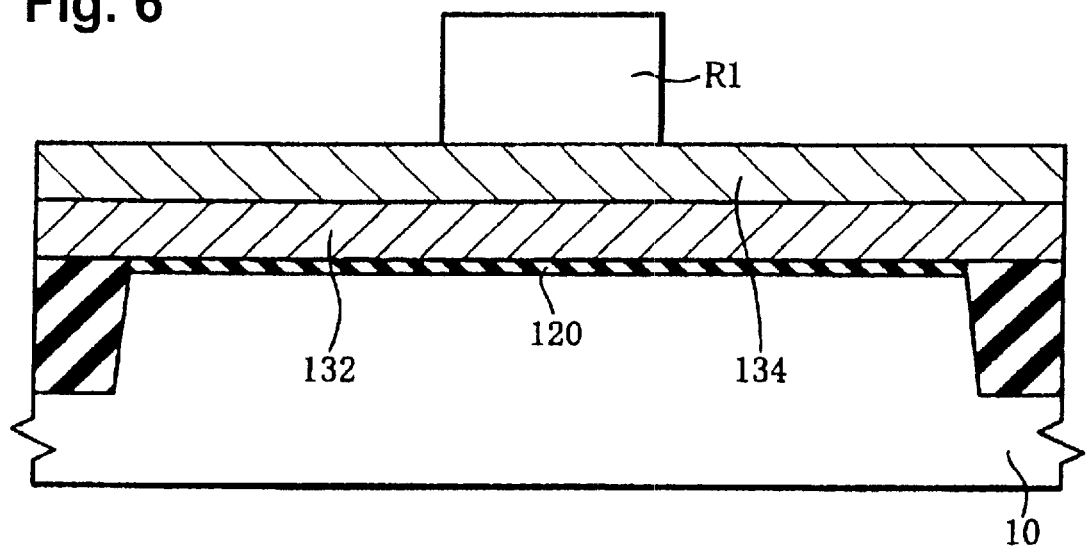
FIG. 6 schematically shows a cross-sectional view illustrating one step of a method for manufacturing a semiconductor device in accordance with an example for comparing the effects.

First, as shown in FIG. 6, a gate dielectric layer 120, a polysilicon layer 132 and a metal layer 134 are successively deposited on a silicon substrate 10. Next, a resist layer R1 is formed on the metal layer 134. Next, the metal layer 134 and the polysilicon layer 132 are etched using the resist layer R1 as a mask, to form a gate electrode 130. Then, the resist layer R1 is removed.

Figure 7:
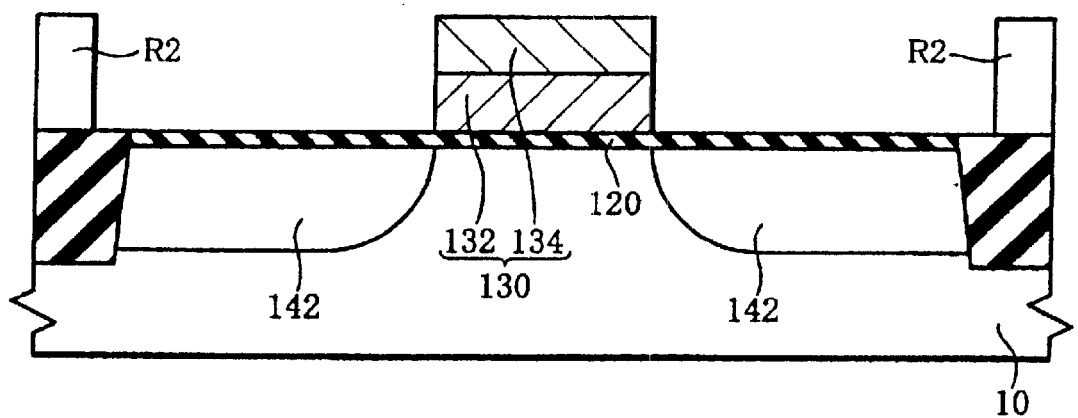
FIG. 7 schematically shows a cross-sectional view illustrating one step of a method for manufacturing a semiconductor device in accordance with an example for comparing the effects.

Next, as shown in FIG. 7, a resist layer R2 having a specified pattern is formed over the silicon substrate 10. Next, an impurity is ion-implanted in the silicon substrate 10 using the resist layer R2 as a mask, to form a low concentration impurity diffusion layer 142. Then, the resist layer R2 is removed.

Figure 8:
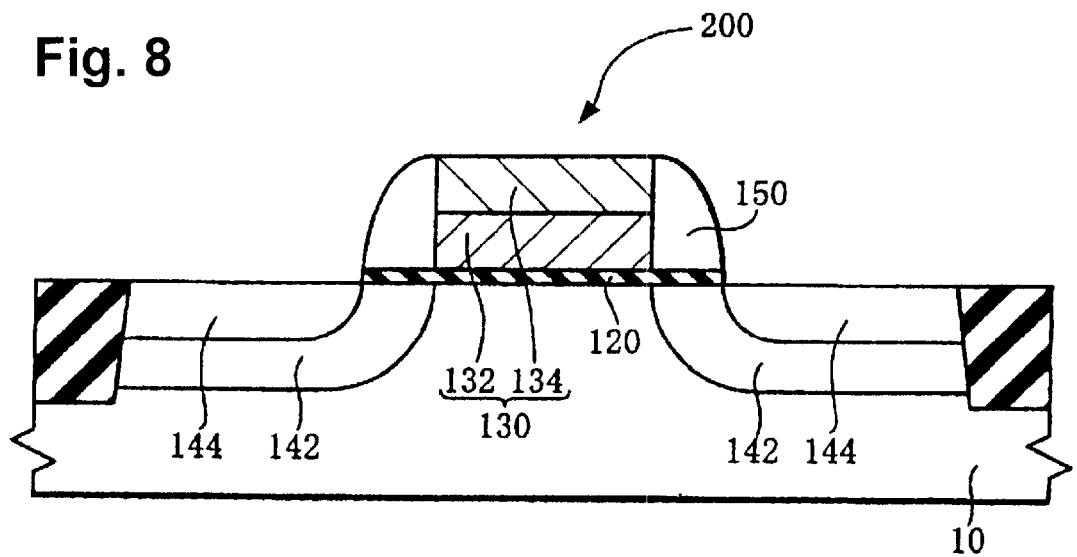
FIG. 8 schematically shows a cross-sectional view illustrating one step of a method for manufacturing a semiconductor device in accordance with an example for comparing the effects.

Next, as shown in FIG. 8, sidewall spacers 150 are formed on side walls of the gate electrode 130. Next, a resist layer having a specified pattern is formed on the silicon substrate 10. Next, an impurity is ion-implanted in the silicon substrate using the resist layer as a mask, to form a high concentration impurity diffusion layer 144. Then, the resist layer is removed. As a result, a MOS transistor 200 is manufactured.

It is noted that the resist layers (the resist layer R1 for forming the gate electrode and the resist layer R2 for forming the impurity diffusion layer) may preferably be removed by an acid chemical agent (for example, sulfuric acid). However, when an acid chemical agent is used for removing the resist layers, the metal layer 134 is exposed to the acid chemical agent, and the metal layer 134 is corroded. When the metal layer 134 is corroded, the electrical characteristic of the semiconductor device deteriorates.

Therefore, when the gate electrode 130 includes a metal layer 134, it is difficult to use an acid chemical agent. On the other hand, although the use of a chemical agent other than an acid chemical agent may be considered, it is difficult to adequately remove the resist layer with such a chemical agent.

However, in accordance with the present embodiment, the metal layer 34 is formed after the source and drain regions 40 are formed. As a result, when the resist layer that is provided for forming the source and drain regions 40 is removed, an acid chemical agent (for example, sulfuric acid) may be used.

The present invention is not limited to the embodiments described above, and many modifications can be made within the scope of the subject matter of the present invention.

What is claimed:

1. A method for manufacturing a semiconductor device, the method comprising the steps of:
   (a) forming a gate dielectric layer;
   (b) forming a first conductive layer having a specified pattern on the gate dielectric layer;
   (c) forming sidewall spacers on side walls of the first conductive layer;
   (d) depositing an insulation layer that covers the first conductive layer and the sidewall spacers;
   (e) planarizing the insulation layer until an upper surface of the first conductive layer is exposed;
   (f) removing a part of the first conductive layer in a manner so that the gate dielectric layer is not exposed, to thereby form a recessed section in the first conductive layer; and
   (g) filling a second conductive layer in the recessed section to form a gate electrode that includes at least the first conductive layer and the second conductive layer.

2. A method for manufacturing a semiconductor device according to claim 1, further comprising, between the step (f) and the step (g), the step (h) of forming a barrier layer above the first conductive layer; and wherein, in step (g), the filling the second conductive layer comprises forming the second conductive layer on the barrier layer so that the barrier layer is positioned between the first conductive layer and the second conductive layer of the gate electrode.

3. A method for manufacturing a semiconductor device according to claim 1, wherein the first conductive layer is formed from a material comprising silicon.

4. A method for manufacturing a semiconductor device according to claim 3, wherein the second conductive layer is formed from a material selected from the group consisting of a metal, a metal alloy and a metal compound.

5. A method for manufacturing a semiconductor device, the method comprising:
   forming a gate dielectric layer on a substrate;
   forming a first conductive layer having a specified pattern on the gate dielectric layer;
   forming sidewall spacers on side walls of the first conductive layer;
   removing a part of the first conductive layer so that the gate dielectric layer is not exposed, to thereby form a recessed section in the first conductive layer; and
   forming a second conductive layer in the recessed section to form a gate electrode that includes at least the first conductive layer and the second conductive layer.

6. A method as in claim 5, further comprising, after forming the sidewall spacers and prior to removing a part of the first conductive layer:

forming an insulation layer over the first conductive layer and over and adjacent to sidewall spacers, and removing a portion of the insulation layer to expose an upper surface of the first conductive layer.

7. A method as in claim 6, wherein the removing a portion comprises planarizing the insulation layer using chemical mechanical polishing.

8. A method as in claim 5, further comprising, after forming the sidewall spacers and prior to removing a part of the first conductive layer:

depositing an insulation layer over the first conductive layer and sidewall spacers; and planarizing the insulation layer, wherein the planarizing includes removing a sufficient quantity of the insulation layer so that the first conductive layer is exposed.

9. A method as in claim 5, further comprising forming a barrier layer between the first conductive layer and the second conductive layer.

10. A method as in claim 5, further comprising, prior to the forming a second conductive layer in the recessed section and after forming the sidewall spacers, conducting an ion implantation into the substrate using a resist mask, and removing the resist mask using an acid chemical agent.

11. A method as in claim 10, further comprising, prior to forming the sidewall spacers and after forming the first conductive layer, conducting an ion implantation into the substrate.

12. A method for manufacturing a semiconductor device, the method comprising:

forming a gate dielectric layer on a substrate;

forming a first conductive layer having a specified pattern on the gate dielectric layer;

after forming the first conductive layer, forming sidewall spacers on sidewalls of the first conductive layer;

etching a portion of the first conductive layer between the sidewall spacers to so that the first conductive layer includes a recessed region defined by angled side surfaces extending downward towards a central surface; and after the etching a portion of the first conductive layer, forming a second conductive layer in the recessed region to form a gate electrode that includes at least the first conductive layer and the second conductive layer.

13. A method according to claim 12, further comprising forming a barrier layer in the recessed region prior to forming the second conductive layer in the recessed region.

14. A method according to claim 12, wherein the barrier layer is formed from a conductive material.

15. A method according to claim 13, wherein the barrier layer is formed from a material selected from the group consisting of titanium nitride, titanium tungsten, tungsten nitride, and tantalum nitride.

16. A method according to claim 12, further comprising forming the first conductive layer from polycrystalline silicon and forming the second conductive layer from a material selected from the group consisting of a metal, a metal alloy and a metal compound.

17. A method according to claim 12, further comprising forming the second conductive layer from a material having a different composition than that of the first conductive material.

18. A method for manufacturing a semiconductor device, the method comprising:

forming a gate dielectric layer on a substrate;

forming a first conductive layer having a specified pattern on the gate dielectric layer;

forming sidewall spacers on sidewalls of the first conductive layer;

removing a portion of the first conductive layer between the sidewall spacers to form a remaining portion of the first conductive layer, wherein the remaining portion of the first conductive layer has a U-shaped upper surface defined by side end sections adjacent to the sidewall spacers and a central section between the side end sections, wherein the side end sections are thicker than the center section; and forming a second conductive layer on the U-shaped upper surface to form a gate electrode that includes at least the remaining portion of the first conductive layer and the second conductive layer, wherein the second conductive layer is formed from a material having a different composition from that of the first conductive layer.

19. A method according to claim 18, further comprising forming a barrier layer on the remaining portion of the first conductive layer prior to forming the second conductive layer.

20. A method according to claim 19, comprising forming source and drain regions in the substrate prior to forming the second conductive layer.

21. A method for manufacturing a semiconductor device, the method comprising:

forming a gate dielectric layer on a substrate;

forming a first conductive layer having a specified pattern on the gate dielectric layer;

after forming the first conductive layer, forming sidewall spacers in direct contact with sidewalls of the first conductive layer;

depositing an insulation layer that covers the first conductive layer and the sidewall spacers;

planarizing the insulation layer until an upper surface of the first conductive layer is exposed;

after planarizing the insulation layer, removing a part of the first conductive layer from between the sidewall spacers so that the gate dielectric layer is not exposed, to thereby form a recessed section in the first conductive layer, the recessed section having a U-shaped structure, wherein the recessed section is defined by side end sections adjacent to the sidewall spacers and a central section between the side end sections, wherein the side end sections are thicker than the center section;

forming a second conductive layer in the recessed section;

wherein a gate electrode is formed that includes at least the first conductive layer and the second conductive layer in the recessed section.

22. A method as in claim 21, further comprising forming a conducting barrier layer on the first conductive layer in the recessed section prior to forming the second conductive layer in the recessed section.

23. A method as in claim 22, wherein the second conductive layer is formed in the recessed section and above the recessed section between the sidewall spacers.

* * * * *